US012813282B2

(12) United States Patent
Lin et al.

(10) Patent No.: US 12,813,282 B2
(45) Date of Patent: Nov. 24, 2026

(54) ELECTRONIC DEVICES

(71) Applicant: Advanced Semiconductor Engineering, Inc., Kaohsiung (TW)

(72) Inventors: Wei-Cheng Lin, Kaohsiung (TW); Hung-Yi Lin, Kaohsiung (TW); Cheng-Yuan Kung, Kaohsiung (TW); Hsu-Chiang Shih, Kaohsiung (TW); Cheng-Yu Ho, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 862 days.

(21) Appl. No.: 17/846,649

(22) Filed: Jun. 22, 2022

(65) Prior Publication Data

US 2023/0420395 A1 Dec. 28, 2023

(51) Int. Cl.

| | |
|---|---|
| ***H10W 44/20*** | (2026.01) |
| ***H10W 20/20*** | (2026.01) |
| ***H10W 40/22*** | (2026.01) |
| ***H10W 70/05*** | (2026.01) |
| ***H10W 70/60*** | (2026.01) |

(Continued)

(52) U.S. Cl.

CPC ........... *H10W 44/20* (2026.01); *H10W 20/20* (2026.01); *H10W 40/22* (2026.01); *H10W 70/05* (2026.01); *H10W 70/093* (2026.01); *H10W 70/611* (2026.01); *H10W 70/614* (2026.01);

(Continued)

(58) Field of Classification Search

CPC ............. H01L 23/66; H01L 2223/6611; H01L 23/49816; H01L 2223/6655; H01L 2224/16225; H01L 23/552; H01L 2223/6677; H01L 25/0657; H01L 23/49827; H01L 21/4857; H01L 23/13; H01L 23/49822; H01L 23/5389; H01L 2924/15311; H03F 1/565; H03F 2200/222; H03F 2200/451; H03F 3/195; H03F 1/0288; H03F 2200/294; H03F 2200/387; H03F 2203/7209; H03F 3/193; H03F 3/213; H03F 3/245; H03F 3/72; H01Q 1/38; H01Q 1/2283; H01Q 1/526; H01Q 1/2275; H01Q 1/2291; H01Q 1/523; H01Q 21/065; H01Q 23/00; H01Q 3/36; H01Q 9/42; H03H 9/0547; H03H 9/02834; H04B 1/0057; H04B 1/0458; H04B 1/48; H10W 44/20;

(Continued)

(56) References Cited

U.S. PATENT DOCUMENTS

| | | | | | |
|---|---|---|---|---|---|
| 5,994,771 | A * | 11/1999 | Sasaki | H01L 23/49827 | 257/773 |
| 2010/0099357 | A1* | 4/2010 | Liu | H01L 23/66 | 455/41.2 |

(Continued)

*Primary Examiner* — Jessica S Manno
*Assistant Examiner* — Victor Joseph Lasasso
(74) *Attorney, Agent, or Firm* — Foley & Lardner LLP

(57) ABSTRACT

The present disclosure provides an electronic device. The electronic device includes a first electronic component and a second electronic component. The first electronic component is configured to receive a radio frequency (RF) signal and amplify a power of the RF signal. The second electronic component is disposed under the first electronic component. The second electronic component includes an interconnection structure passing through the second electronic component. The interconnection structure is configured to provide a path for a transmission of the RF signal.

20 Claims, 15 Drawing Sheets

(51) Int. Cl.
*H10W 70/65* (2026.01)
*H10W 70/685* (2026.01)

(52) U.S. Cl.
CPC ......... *H10W 70/65* (2026.01); *H10W 70/685* (2026.01); *H10W 44/248* (2026.01)

(58) Field of Classification Search
CPC .. H10W 90/00; H10W 90/724; H10W 44/248
See application file for complete search history.

(56) References Cited

U.S. PATENT DOCUMENTS

| | | | | |
|---|---|---|---|---|
| 2017/0317710 | A1* | 11/2017 | Liu | H04B 1/48 |
| 2018/0316099 | A1* | 11/2018 | Iwamoto | H01Q 1/2275 |
| 2018/0331051 | A1* | 11/2018 | Dogiamis | H01L 23/66 |
| 2018/0337148 | A1* | 11/2018 | Baek | H01L 24/20 |
| 2020/0373244 | A1* | 11/2020 | Kang | H01L 23/552 |
| 2021/0313285 | A1* | 10/2021 | Noori | H01L 23/49861 |
| 2021/0336647 | A1* | 10/2021 | Yamaguchi | H03F 3/245 |
| 2021/0366849 | A1* | 11/2021 | Iwamoto | H01L 23/5389 |

* cited by examiner

ELECTRONIC DEVICES

BACKGROUND

1. Field of the Disclosure

The present disclosure generally relates to an electronic device.

2. Description of the Related Art

To reduce the size and achieve higher integration of electronic device packages, several packaging solutions, such as mmWave radio frequency integrated circuit (RFIC) have been developed and implemented.

However, to support the industry's demand for increased electronic functionality, the size and/or form factor of the electronic device packages will inevitably be increased, and some applications may be limited (e.g., in portable devices).

SUMMARY

In some embodiments, an electronic device includes a first electronic component and a second electronic component. The first electronic component is configured to receive a radio frequency (RF) signal and amplify a power of the RF signal. The second electronic component is disposed under the first electronic component. The second electronic component includes an interconnection structure passing through the second electronic component. The interconnection structure is configured to provide a path for a transmission of the RF signal.

In some embodiments, an electronic device includes a power amplifier and a radio frequency (RF) component. The RF component is electrically connected to the power amplifier through a through-silicon via (TSV).

In some embodiments, an electronic device includes an antenna component, a power amplifier, and a radio frequency (RF) component. The power amplifier is over the antenna component. The RF component is disposed between the power amplifier and the antenna component.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
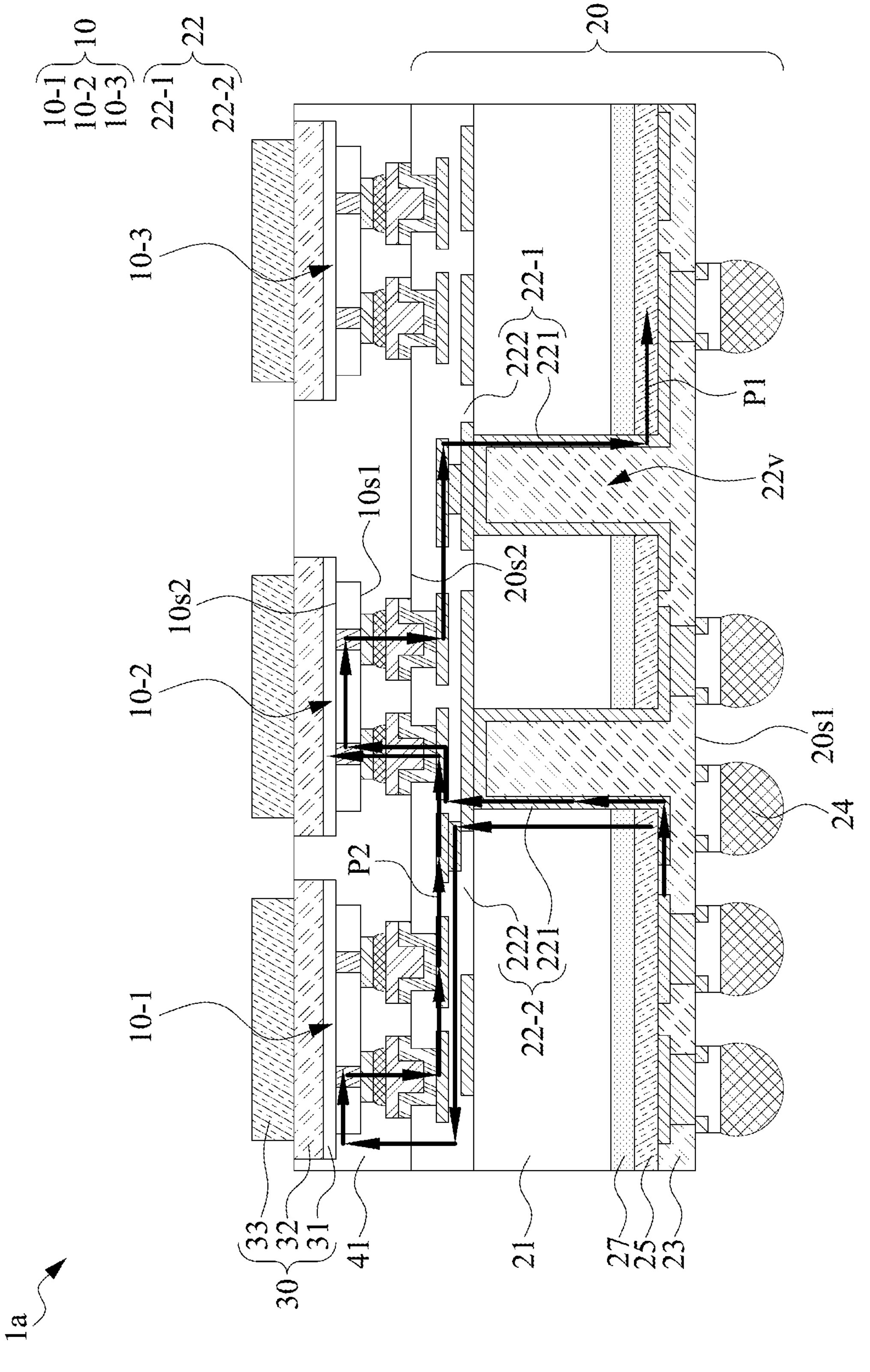
FIG. 1 is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of an electronic device 1*a*, in accordance with an embodiment of the present disclosure. In some embodiments, the electronic device 1*a* may include a plurality of electronic components 10 (e.g., 10-1, 10-2, and/or 10-3), an electronic component 20, a plurality of conductive structures 30, and an encapsulant 41.

The electronic component 10 may be disposed on or over the electronic component 20. Each of the electronic components 10 may be electrically connected to the electronic component 20, and the electrical connection may be attained by way of flip-chip, wire-bond techniques, metal to metal bonding (such as Cu to Cu bonding), or hybrid bonding.

The electronic component 10 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 10 may include a power amplifier integrated circuit. In some embodiments, the electronic component 10 may be configured to receive an electrical signal and amplify the power of the electrical signal. For example, the electronic component 10 may be configured to receive a radio frequency (RF) signal and amplify the power of the RF signal. In some embodiments, the electronic component 10 may be configured to receive and/or transmit the signal from the electronic component 20. In some embodiments, the electronic component 10 may be configured to amplify the power of the signal from the electronic component 20. In some embodiments, the electronic component 10 may also be referred to as a power amplifying die.

Figure 2:
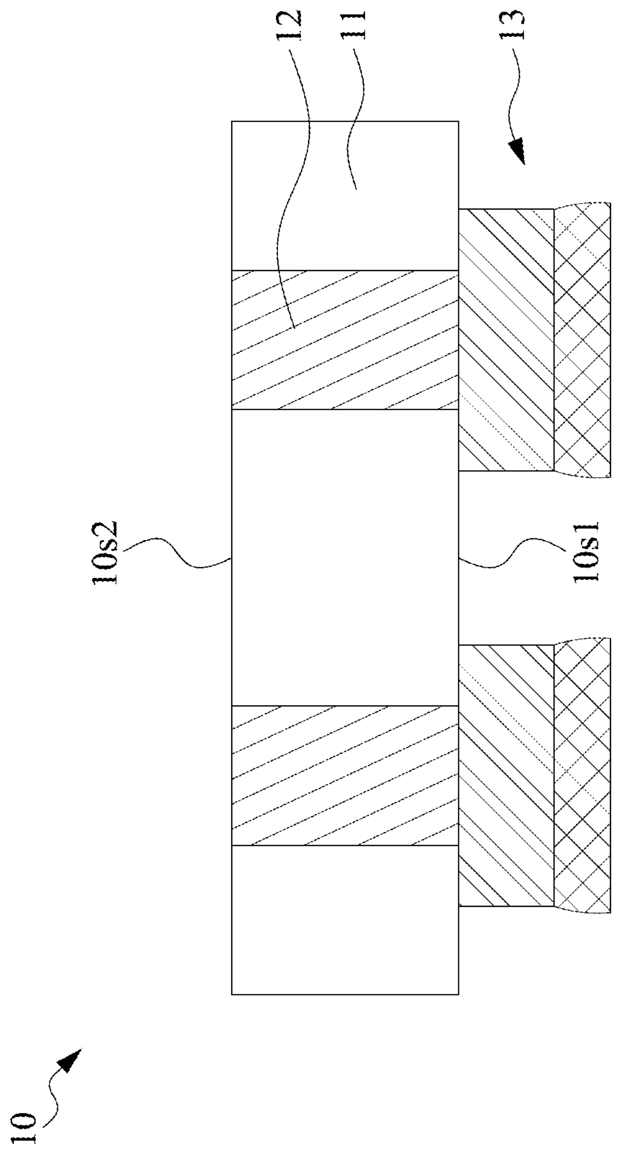
FIG. 2 is a cross-sectional view of a power amplifying die, in accordance with an embodiment of the present disclosure.

Please refer to FIG. 2, which is a cross-sectional view of a signal amplifying die, such as the electronic component 10 of FIG. 1, in accordance with an embodiment of the present disclosure.

In some embodiments, the electronic component 10 may include a substrate 11, at least one through-via 12 (or a conductive via), and a terminal(s) 13. The electronic component 10 may include a surface **10*s*1 and a surface 10*s*2 opposite to the surface 10*s*1. In some embodiments, the surface 10*s*1 may also be referred to as an active surface. In some embodiments, the surface 10*s*2** may also be referred to as a backside surface.

The substrate 11 may be a semiconductor substrate. In some embodiments, the substrate 11 may include a group III-V structure. The substrate 11 may include, but is not limited to, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$. In some embodiments, the substrate 11 may include a gallium nitride (GaN) substrate or other suitable substrates.

In some embodiments, the through-via 12 may penetrate the substrate 11. In some embodiments, the through-via 12 may extend between the surfaces **10*s*1 and 10*s*2 of the electronic component 10. The through-via 12 may be configured to provide a path for transmitting heat of the electronic component 10 and/or the electronic device 1*a*. The through-via 12** may include conductive material(s), such as copper (Cu), tungsten (W), ruthenium (Ru), iridium (Ir), nickel (Ni), osmium (Os), ruthenium (Rh), aluminum (Al), molybdenum (Mo), cobalt (Co), alloys thereof, combinations thereof or any metallic materials.

The terminal 13 may be disposed on the surface **10*s*1 of the electronic component 10. The terminal 13** may include, for example, a conductive pad (not annotated in the figures), a solder material (not annotated in the figures) on the conductive pad, and/or other suitable elements.

Referring back to FIG. 1, the electronic component 20 may be a chip or a die including a semiconductor substrate, one or more IC devices, and one or more overlying interconnection structures therein.

In some embodiments, the electronic component 20 may be configured to generate, emit, and/or transmit an electrical signal, such as an RF signal. The electronic component 20 may include a surface **20*s*1 and a surface 20*s*2 opposite to the surface 20*s*1. The surface 20*s*1 may also be referred to as an active surface. The surface 20*s*2 may also be referred to as a backside surface. In some embodiments, each of the electronic components 10 may be disposed on the surface 20*s*2 of the electronic component 20. The electronic component 20 may be electrically connected to the electronic component 10. In some embodiments, the surface 10*s*1 of the electronic component 10 may face the surface 20*s*2 of the electronic component 20. In some embodiments, the electronic component 20** may also be referred to as an RF die.

In some embodiments, the electronic component 20 may include a substrate 21, a plurality of interconnection structures 22 (e.g., 22-1 and 22-2), a dielectric structure 23, terminal(s) 24, and a passivation layer 25, and an active circuit 27 (or an active circuit region).

The substrate 21 may be a semiconductor substrate. In some embodiments, the substrate 21 may include silicon, germanium, and a combination thereof.

The active circuit 27 may be disposed within the substrate 21. The active circuit 27 may include active devices such as transistors and/or passive devices such as resistors, capacitors, inductors, or a combination thereof. For example, the active circuit 27 may include a radio frequency integrated circuit (RFIC), an application-specific IC (ASIC), a central processing unit (CPU), a microprocessor unit (MPU), a graphics processing unit (GPU), a microcontroller unit (MCU), a field-programmable gate array (FPGA), or another type of IC. In some embodiments, the active circuit 27 of the electronic component 20 may include an analog to digital converter, a digital to analog converter, a switch, a mixer, a low noise amplifier (LNA), and/or other integrated circuits (not shown in the figures). The active circuit 27 may be disposed adjacent to the surface of the electronic component 20. In some embodiments, the active circuit 27 may also be referred to as an active circuit, and the active circuit 27 may be disposed within an active circuit region (not annotated in the figures) of the electronic component 20.

In some embodiments, the interconnection structure 22 may penetrate the electronic component 20. In some embodiments, the interconnection structure 22 may penetrate the substrate 21. In some embodiments, the interconnection structure 22 may be configured to provide a signal transmission path between the electronic components 10 and 20. In some embodiments, the interconnection structure 22 may include a via 221 and a redistribution layer 222. In some embodiments, the via 221 be disposed within a hole **22*v* defined by the substrate 21. In some embodiments, the via 221 may penetrate the electronic component 20. In some embodiments, the via 221 may penetrate the substrate 21. In some embodiments, the via 221** may include a silicon-through via (TSV).

In some embodiments, the redistribution layer 222 may be disposed on the backside surface (not annotated in the figures) of the substrate 21. The redistribution layer 222 may include one or more dielectric layers (not annotated in the figures) and one or more traces (not annotated in the figures) embedded therein. In some embodiments, the redistribution layer 222 may be electrically connected to the via 221. In some embodiments, the redistribution layer 222 may be disposed adjacent to the surface **20*s*2 of the electronic component 20. The redistribution layer 222 may be disposed between the substrate 21 of the electronic component 20 and the electronic component 10**.

In some embodiments, the electronic component 20 may be electrically connected to the electronic component 10 through the interconnection structure 22. In some embodiments, the active circuit 27 of the electronic component 20 may be electrically connected to the via 221 and the redistribution layer 222. In some embodiments, a signal (e.g., RF signal) may be transmitted from the electronic component 20 to the electronic component 10 through the interconnection structure 22. For example, a signal transmission path P1 may pass through the active circuit 27 of the electronic component 20, the via 221 of the interconnection structure 22-2, the redistribution layer 222, the ICs of the electronic component 10-2, the redistribution layer 222, and the via 221 of the interconnection structure 22-1. In some embodiments, a signal passing through the via 221 may be configured to be transmitted to an antenna component (e.g., 80 of FIG. 8A). In some embodiments, the interconnection structure 22 may electrically connect the electronic components 10 and 20 through an active circuit region (e.g., the region within which the active circuit 27 are disposed or the region near the surface **20*s*1) and a non-active circuit region (e.g., the region near the surface 20*s*2 and/or the redistribution layer 222). In some embodiments, the signal transmission path P1 may include or pass through the active circuit 27 of the electronic component 20, the interconnection structure 22-2, the electronic component 10, the interconnection structure 22-1, a filter circuit (not shown in this figure), and an antenna component (not shown in this figure). In some embodiments, the signal transmission path P1 may be a transmission path of a signal transmitter (e.g., Tx). In some embodiments, the terminals (e.g., input and out terminals) of the electronic component 10 may be misaligned to the interconnection structure 22. In some embodiments, the terminals (e.g., input and out terminals) of the electronic component 10 may be misaligned to the via 221**.

In some embodiments, the electronic components 10 may be electrically connected to each other by the interconnection structure 22. For example, the electronic component 10-1 may be electrically connected to the electronic component 10-2 through the redistribution layer 222 of the interconnection structure 22. A signal transmission path P2 may pass through the ICs of the electronic component 10-1, the redistribution layer 222 of the electronic component 20, and the ICs of the electronic component 10-2. In some embodiments, the signal transmission path P2 may include or pass through the active circuit 27, the interconnection structure 22-2, electronic components 10-1 and 10-2, the interconnection structure 22-1, a filter circuit (not shown in this figure), as well as an antenna component (not shown in this figure). In some embodiments, the signal transmission path P2 may be a transmission path of a signal transmitter (e.g., Tx). In some embodiments, the signal transmission path P2 may include or pass through two or more electronic components 10 based on a requirement of gain of an RF signal.

The dielectric structure 23 may be disposed adjacent to the surface 20$s$1 of the electronic component 20. In some embodiments, the dielectric structure 23 may fill the hole 22$v$. The dielectric structure 23 may include, for example, silicon oxide ($SiO_2$), silicon nitride ($Si_3N_4$), silicon oxynitride ($N_2OSi_2$), silicon nitride oxide ($N_2OSi_2$), or other suitable materials.

The terminals 24 may be disposed on the surface 20$s$1 of the electronic component 20. The terminal 24 may include, for example, a conductive pad (not annotated in the figures), a solder material (not annotated in the figures) on the conductive pad, and/or other suitable elements.

The passivation layer 25 may be disposed on the substrate 21 to protect the ICs within the electronic component 20 from damage. The passivation layer 25 may include, for example, silicon oxide ($SiO_2$), silicon nitride ($Si_3N_4$), silicon oxynitride ($N_2OSi_2$), silicon nitride oxide ($N_2OSi_2$), or other suitable materials. In some embodiments, conductive traces (not shown) may be disposed within the passivation layer 25, and the ICs 27 may be electrically connected to the interconnection structure 22 and/or terminal 42 through the traces within the passivation layer 25.

In some embodiments, the conductive structure 30 (or a heat dissipating structure) may be disposed on the surface 10$s$2 of the electronic component 10. In some embodiments, the conductive structure 30 may be configured to provide a path for transmitting heat of the electronic component 10 and/or electronic device 1$a$. In some embodiments, the conductive structure 30 may be configured to provide a path for transmitting heat from the through-via 12 of the electronic component 10. The conductive structure 30 may be a thermal dissipating structure. In some embodiments, the conductive structure 30 may include a multilayered structure. In some embodiments, the conductive structure 30 may include a thermal interface material 31, a thermal conductive layer 32, and a heat dissipating layer 33. The thermal interface material 31 may include, for example, sintered silver. The thermal conductive layer 32 may include copper or other suitable materials. The heat dissipating layer 33 may include, for example, a solder material. In some embodiments, the conductive structure 30 may serve as a terminal of the electrical signal transmission. In some embodiments, the conductive structure 30 may be free of an electrical signal transmission. In some embodiments, a surface area of the thermal interface material 31 may be greater than that of the substrate 11 of the electronic component 10. In some embodiments, a surface area of the thermal conductive layer 32 may be greater than that of the substrate 11 of the electronic component 10. In some embodiments, the conductive structure 30 may serve as a thermal conductive structure and/or a thermal dissipating structure.

In some embodiments, the encapsulant 41 may be disposed on the surface 20$s$2 of the electronic component 20. In some embodiments, the encapsulant 41 may encapsulate the electronic components 10. In some embodiments, the encapsulant 41 may encapsulate the conductive structure 30. In some embodiments, the encapsulant 41 may encapsulate the thermal interface material 31. In some embodiments, the encapsulant 41 may encapsulate the thermal conductive layer 32. In some embodiments, the heat dissipating layer 33 may be exposed by the encapsulant 41 in order to improve the heat dissipation performance. The encapsulant 41 may include insulation or dielectric material. For example, the encapsulant 41 may include a molding compound. In some embodiments, the encapsulant 41 may be made of molding material that may include, for example, a Novolac-based resin, an epoxy-based resin, a silicone-based resin, or other another suitable encapsulant. Suitable fillers may also be included, such as powdered $SiO_2$.

In a comparative example, a monolithic microwave integrated circuit (MMIC) die is utilized to integrate the power amplifier IC and the RF IC. However, the MMIC die may incur a relatively high cost. In another comparative example, the power amplifier IC and the RF IC are formed in individual substrates, and the RF die and the power amplifying die are electrically connected through a trace outside the RF die and the power amplifying die. Such trace provides a relatively long signal transmission path between the RF die and the power amplifying die, increasing signal loss.

In this embodiment, an interconnection structure (e.g., 22-1 and 22-2) is utilized to electrically connect the power amplifying die (e.g., 10) and the RF die (e.g., 20), the substrates of which are made of different materials. The interconnection structure is formed within the electronic component 20 and provides a signal transmission path between the electronic components 10 and 20 as well as between the electronic components 10 (e.g., 10-1 and 10-2). The interconnection structure 22 may provide a relatively short signal transmission path between the electronic components 10 and 20, which thereby reduces the signal loss and thus enhances the performance of the electronic device 1$a$.

Figure 3:
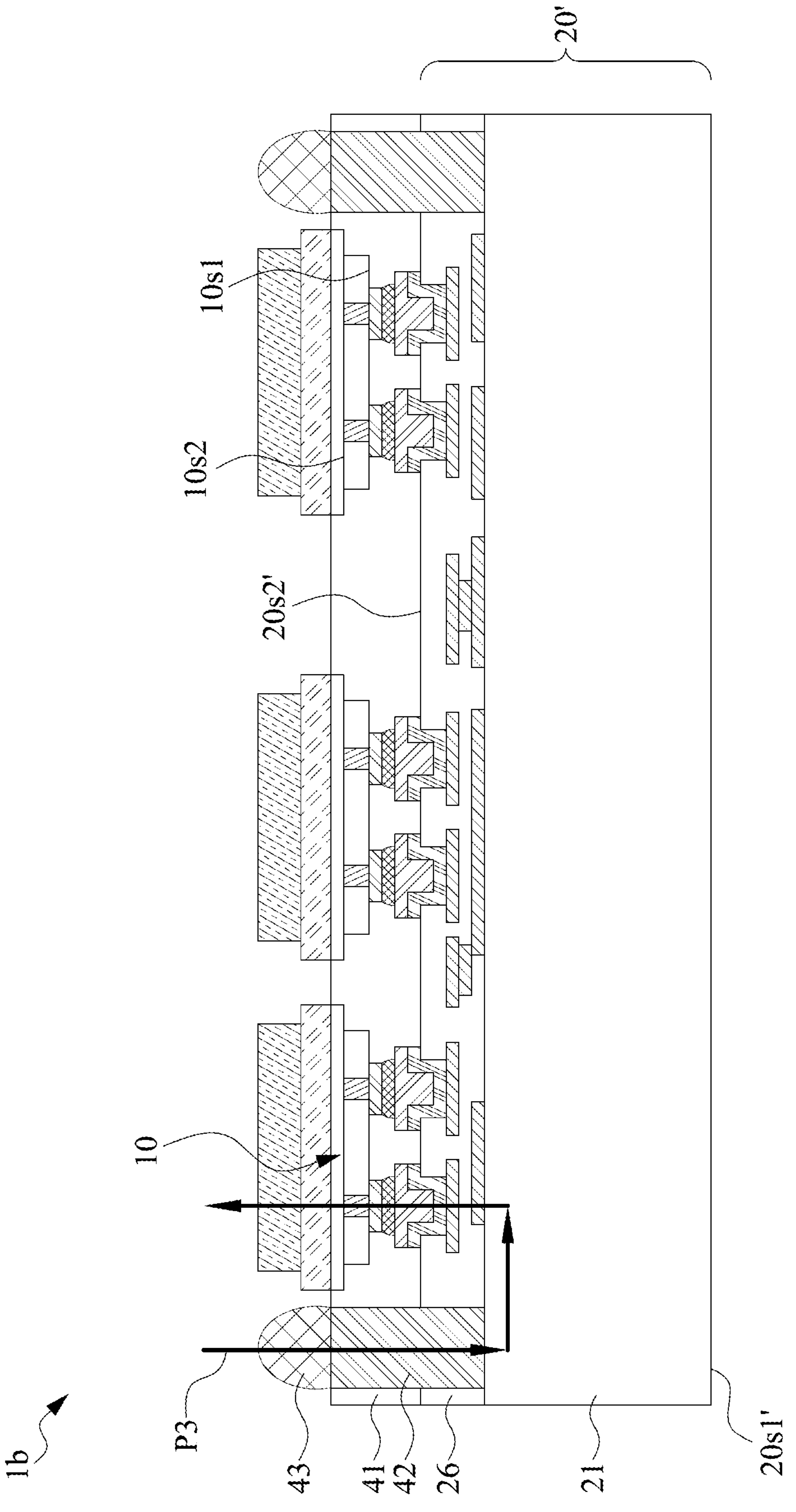
FIG. 3 is a cross-sectional view of an electronic device, in accordance with an embodiment of the present disclosure.

FIG. 3 is a cross-sectional view of an electronic device 1$b$, in accordance with an embodiment of the present disclosure. The electronic device 1$b$ is similar to the electronic device 1$a$ as shown in FIG. 1, and the differences therebetween are described below.

The electronic device 1$b$ may include an electronic component 20'. The electronic component 20' may include a surface 20$s$1' and a surface 20$s$2' opposite to the surface 20$s$1'. In some embodiments, the surface 20$s$1' may also be referred to as a backside surface. In some embodiments, the surface 20$s$2' may also be referred to as an active surface. In this disclosure, the active surface may refer to a surface on which an active circuit or an active circuit region is disposed. In some embodiments, the surface of the electronic component 10 may face the surface 20$s$2' of the electronic component 20.

A redistribution layer 26 may be disposed on the surface 20$s$2' of the electronic component 20. In some embodiments, the electronic component 10 may be electrically connected to the electronic component 20 through the redistribution layer 26.

The electronic device 1*b* may include a conductive structure 42 and a terminal 43. In some embodiments, the conductive structure 42 may be disposed on the surface of the electronic component 20. In some embodiments, the conductive structure 42 may penetrate the encapsulant 41. In some embodiments, the conductive structure 42 may penetrate the redistribution layer 26. The conductive structure 42 may include conductive material(s), such as copper (Cu), tungsten (W), ruthenium (Ru), iridium (Ir), nickel (Ni), osmium (Os), ruthenium (Rh), aluminum (Al), molybdenum (Mo), cobalt (Co), alloys thereof, combinations thereof or any metallic materials.

The terminal 43 may be disposed on the encapsulant 41. The terminal 43 may be disposed on the conductive structure 42. The terminal 43 may include, for example, a solder material, such as alloys of gold and tin solder or alloys of silver and tin solder.

In some embodiments, a signal transmission path P3 may pass through the terminal 43, the conductive structure 42, the ICs (not shown) of the electronic component the redistribution layer 26 and the electronic component 10.

Figure 4:
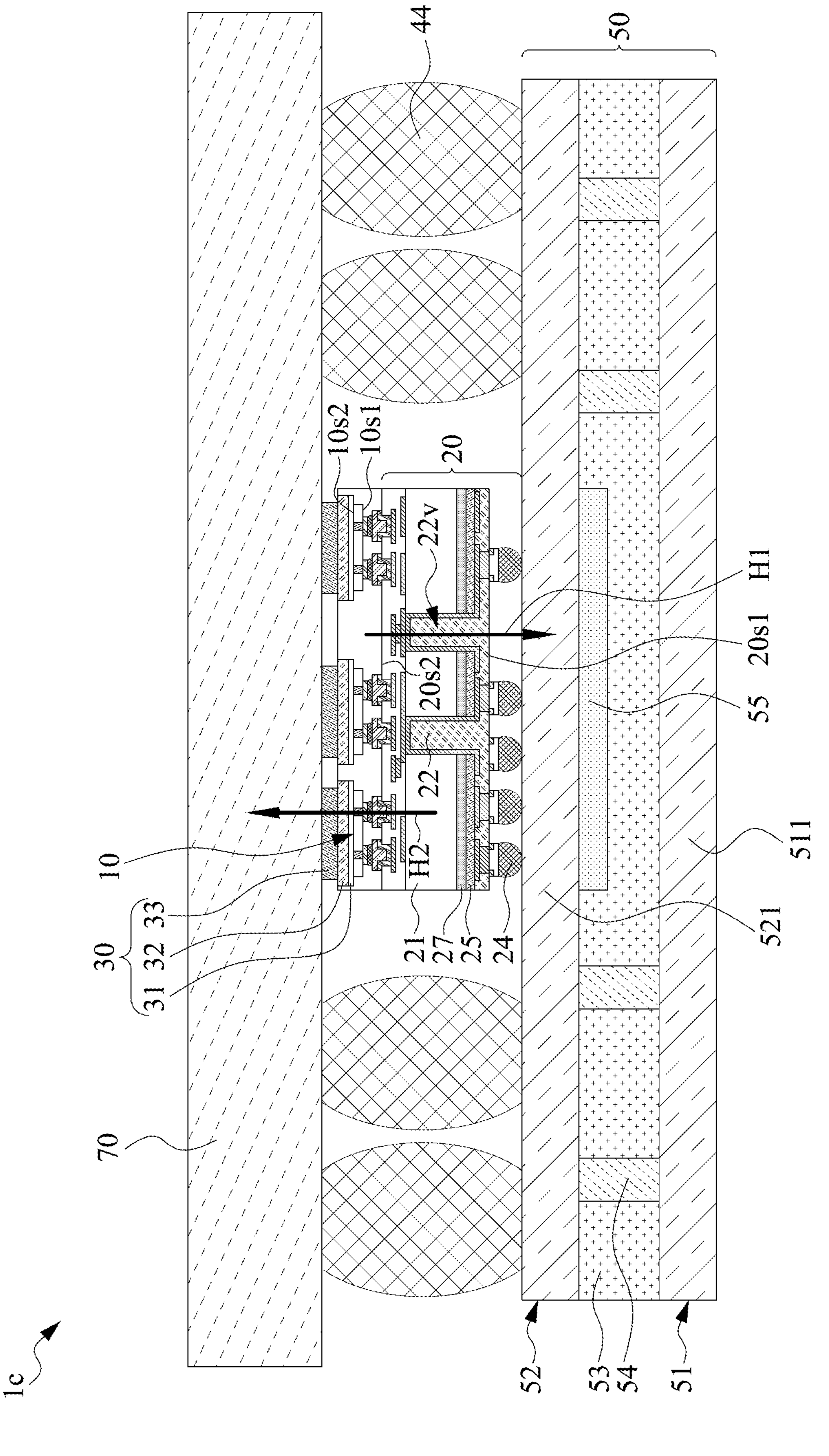
FIG. 4 is a cross-sectional view of an electronic device, in accordance with an embodiment of the present disclosure.

FIG. 4 is a cross-sectional view of an electronic device 1*c*, in accordance with an embodiment of the present disclosure. The electronic device 1*c* is similar to the electronic device 1*a* as shown in FIG. 1, and the differences therebetween are described below.

In some embodiments, the electronic device 1*c* may further include a circuit structure 50 and a circuit board 70.

The circuit structure 50 may be disposed below the electronic component 20. In some embodiments, the electronic component 20 may be disposed between the electronic component 10 and the circuit structure 50. The circuit structure 50 may include a redistribution layer 51, a redistribution layer 52, a dielectric layer 53, a conductive structure 54, and a filter circuit 55.

In some embodiments, the redistribution layer 51 may include a dielectric layer 511 and traces (not annotated in the figures) embedded therein. In some embodiments, the dielectric layer 511 of the redistribution layer 51 may have a relatively small dielectric constant ranging from about 3 to about 5, such as 3, 3.2, 3.4, 3.6, 3.8, 4, 4.2, 4.4, 4.6, 4.8, or 5. The dielectric layer 511 may include, for example, pre-impregnated composite fibers (e.g., pre-preg) or other suitable materials.

In some embodiments, the redistribution layer 52 may include a dielectric layer 521 and traces (not annotated in the figures) embedded therein. In some embodiments, the dielectric layer 521 of the redistribution layer 52 may have a relatively small dielectric constant ranging from about 3 to 5, such as 3, 3.2, 3.4, 3.6, 3.8, 4, 4.2, 4.4, 4.6, 4.8, or 5. The dielectric layer 521 may include, for example, pre-impregnated composite fibers (e.g., pre-preg) or other suitable materials.

In some embodiments, the dielectric layer 53 may be disposed between the dielectric layers 511 and 521. The dielectric layer 53 may have a relatively high dielectric constant greater than about 5, such as 5, 5.5, 6, 6.5, 7, 7.5, 8, 8.5, 9, 9.5, 10 or more. The dielectric layer 53 may include, for example, alumina or other suitable materials.

In some embodiments, the conductive structure 54 may penetrate the dielectric layer 53. The conductive structure 54 may be electrically to the redistribution layers 51 and 52.

In some embodiments, the filter circuit 55 may be at least partially or completely disposed in the dielectric layer 53. In some embodiments, a portion of the filter circuit 55 may be disposed in the dielectric layer 521. In some embodiments, the filter circuit 55 may be configured to filter the noise of the signal of the electronic component 20. For example, the filter circuit 55 may be configured to filter the noise of the RF signal of the electronic component 20. In some embodiments, the filter circuit 55 may include a surface acoustic wave filter (SAW filter). The filter circuit 55 may be configured to filter an image signal during frequency upconversion. At an emitting terminal, the filter circuit 55 may be configured to let a signal lower than a predetermined frequency pass through. In some embodiments, the filter circuit 55 may include a low pass filter (LPF). In some situations, when a signal passes through a power amplifier, harmonics, whose frequencies are greater than that of the original signal, may be generated. In some embodiments, the filter circuit 55 may be configured to filter the harmonics. In some embodiments, the filter circuit 55 may be front of an LNA, which may prevent a noise (e.g., out-band noise) from damaging the performance of a signal receiver (e.g., Rx). In some embodiments, the filter 55 may be configured to filter a noise of a signal from a signal transmitter and/or a signal receiver.

In a comparative example, a filter circuit is disposed within a substrate including silicon, and the filter circuit may be interfered with by the substrate. In this embodiment, the filter circuit 55 may be located outside of the electronic component 20, and thus provide better performance. The filter circuit 55 may be disposed within a dielectric layer with a relatively high dielectric constant, which may allow a smaller filter circuit 55 to be used In some embodiments, the circuit board 70 may be disposed over the electronic component 10. In some embodiments, the circuit board 70 may be disposed on the conductive structure 30. In some embodiments, the circuit board 70 may be thermally connected to the conductive structure 30. In some embodiments, the circuit board 70 may function as a heat dissipating substrate for transmitting heat of the electronic device 1*c*. In some embodiments, the circuit board 70 may be electrically connected to the circuit structure 50 through a plurality of electrical connections 44 (e.g., solder material). In some embodiments, a digital controller (not shown) may be disposed on the circuit board 70 and electrically connected to the electronic device 1*c* through the circuit board 70. In some embodiments, the circuit board 70 may serve as a heat dissipation substrate.

In some embodiments, a heat transmission path H1 may pass through the electronic component 10, the electronic component 20, and the circuit structure 50. In some embodiments, a heat transmission path H2 may pass through the electronic component 10, the electronic component 20, the conductive structure 30, and an external device (e.g., the circuit board 70). In some embodiments, the heat transmission path H2 has a better heat dissipation capability than the heat transmission path H1. In some embodiments, the heat transmission path H2 may provide a better heat dissipating performance in comparison with the heat transmission path H1 because the conductive structure 30 and/or the circuit board 70 has a relatively large heat transfer coefficient. That is, the heat transmission path H2 is superior to the heat transmission path H1.

Figure 5:
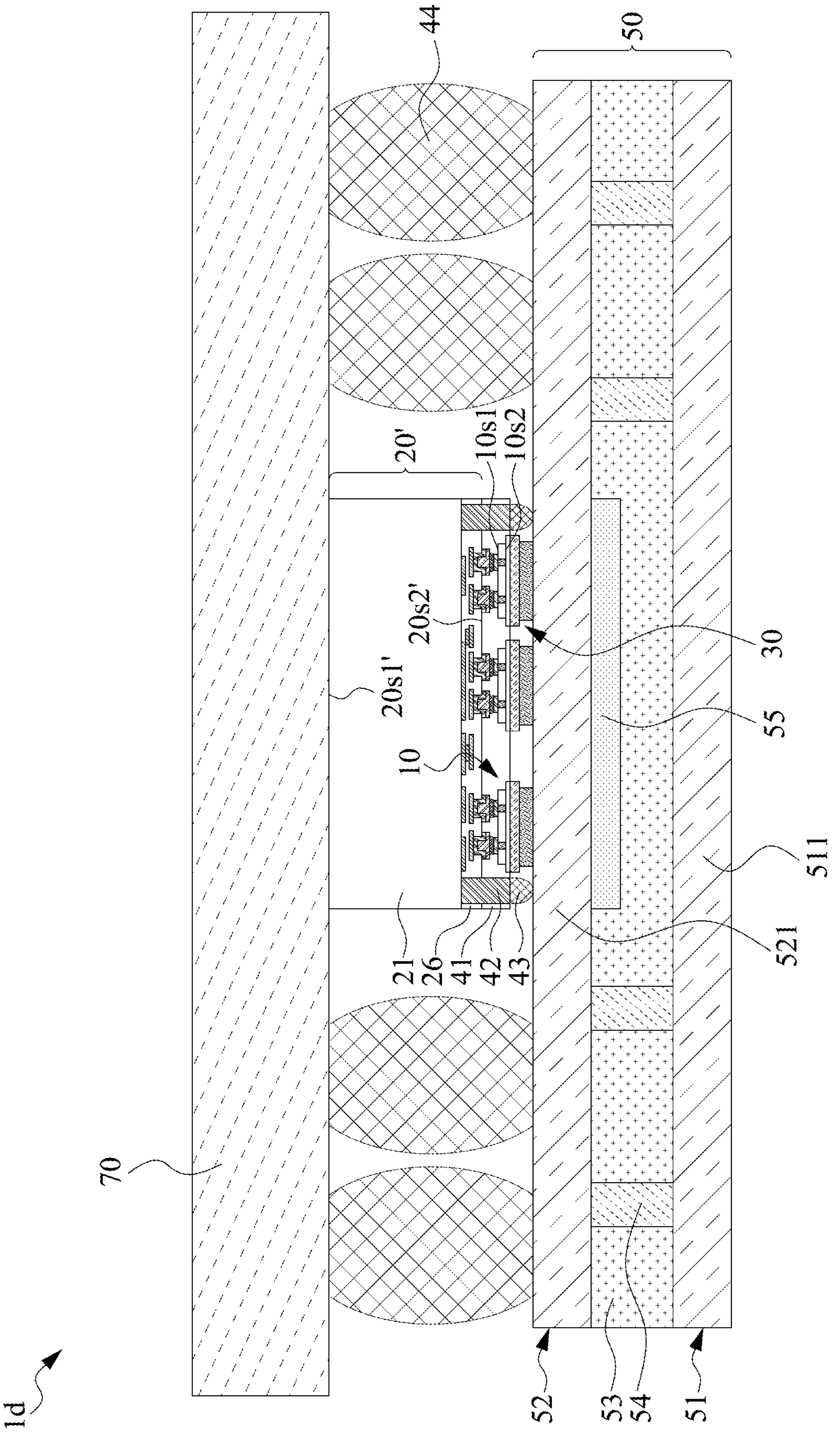
FIG. 5 is a cross-sectional view of an electronic device, in accordance with an embodiment of the present disclosure.

FIG. 5 is a cross-sectional view of an electronic device 1*d*, in accordance with an embodiment of the present disclosure. The electronic device 1*d* is similar to the electronic device 1*b* as shown in FIG. 3, and the differences therebetween are described below.

In some embodiments, the electronic device 1*d* may further include the circuit structure 50 and the circuit board 70. In some embodiments, the circuit structure 50 may be disposed on the surface 20*s*2' of the electronic component 20'. In some embodiments, the terminal 43 may be electrically connected to the redistribution layer 52 of the circuit structure 50. The conductive structure 30 may be disposed on the redistribution layer 52 of the circuit structure 50.

In some embodiments, the circuit board 70 may be disposed on the surface 20*s*1' of the electronic component 20'. The circuit board 70 may be electrically connected to the circuit structure 50 through the electrical connection 44.

Figure 6:
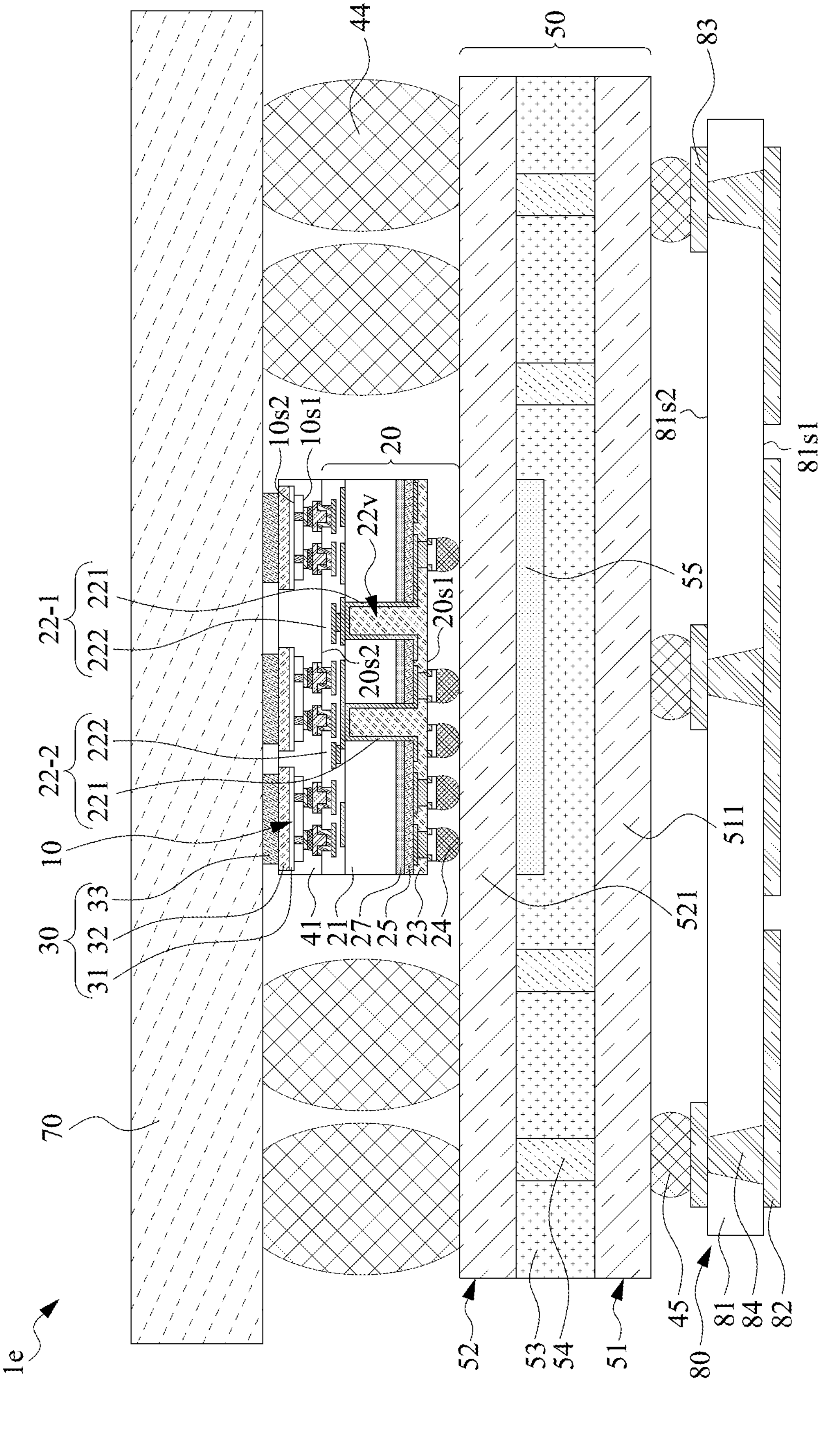
FIG. 6 is a cross-sectional view of an electronic device, in accordance with an embodiment of the present disclosure.

FIG. 6 is a cross-sectional view of an electronic device 1*e*, in accordance with an embodiment of the present disclosure. The electronic device 1*e* is similar to the electronic device 1*c* as shown in FIG. 4, and the differences therebetween are described below.

In some embodiments, the electronic device 1*d* may further include an antenna component 80.

In some embodiments, the antenna component 80 may be disposed on the circuit structure 50. In some embodiments, the circuit structure 50 may be disposed between the electronic component 20 and the antenna component 80. In some embodiments, the antenna component 80 may be disposed on or face the surface 20*s*1 of the electronic component 20. In some embodiments, the antenna component 80 may be electrically connected to the circuit structure 50 through electrical connection(s) 45 (e.g., solder material). In some embodiments, the antenna component 80 may be configured to radiate and/or receive electromagnetic signals, such as radio frequency (RF) signals. For example, the antenna component 80 may be configured to operate in a frequency between about 10 GHz and about 40 GHz, such as 10 GHz, 20 GHz, 30 GHz, or 40 GHz. In some embodiments, the antenna component 80 may be configured to operate in a frequency between about 30 GHz and about 300 GHz. In some embodiments, the antenna component may be configured to operate in a frequency between about 300 GHz and about 10 THz. In some embodiments, the antenna component 80 may support fifth generation (5G) communications, such as Sub-6 GHz frequency bands and/or millimeter (mm) wave frequency bands. For example, the antenna component 80 may incorporate both Sub-6 GHz antennas and mm wave antennas. In some embodiments, the antenna component 80 may support beyond-5G or 6G communications, such as terahertz (THz) frequency bands. In some embodiments, the antenna component 80 may include a substrate 81, an antenna pattern 82, an antenna pattern 83, and a through-via 84.

The substrate 81 may include pre-impregnated composite fibers or ceramic-filled polytetrafluoroethylene (PTFE) composites, liquid crystal polymer laminate, polyimide-based films, or other suitable materials. The substrate 81 may include a surface 81*s*1 and a surface 81*s*2 opposite to the surface 81*s*1. The surface 81*s*2 of the substrate 81 may face the circuit structure 50.

The antenna pattern 82 may be disposed on the surface 81*s*1 of the substrate 81. In some embodiments, the antenna pattern 82 may be configured to radiate and/or receive electromagnetic signals, such as RF signals. In some embodiments, the antenna pattern 82 may include an antenna array.

The antenna pattern 83 may be disposed on the surface 81*s*2 of the substrate 81. The antenna pattern 83 may be electrically connected to the antenna pattern 82 through a through-via 84. In some embodiments, the antenna pattern 83 may be configured to transmit the signal from the electronic component 20 to the antenna pattern 82 or transmit the signal from the antenna pattern 82 to the electronic component 20.

Figure 7:
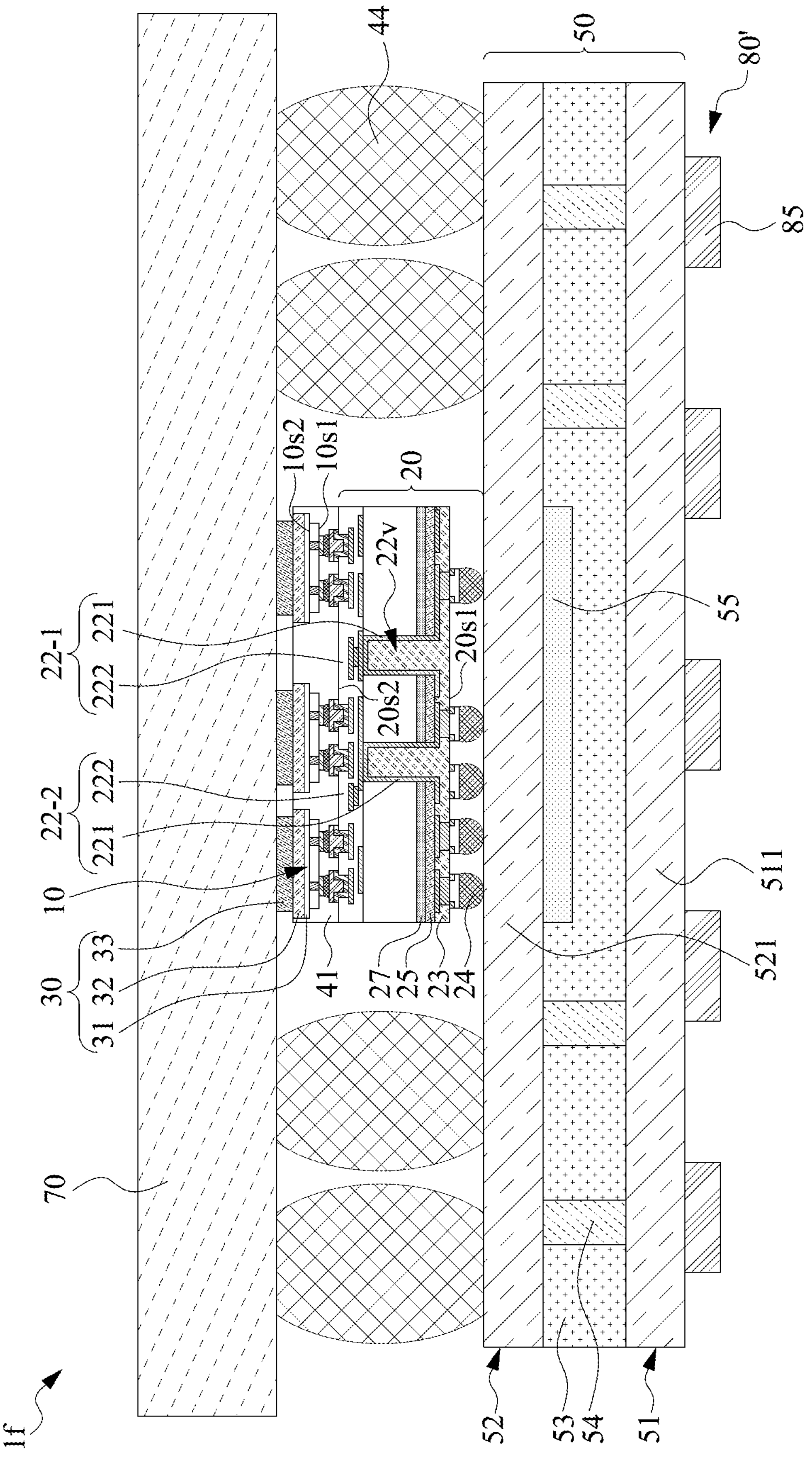
FIG. 7 is a cross-sectional view of an electronic device, in accordance with an embodiment of the present disclosure.

FIG. 7 is a cross-sectional view of an electronic device 1*f*, in accordance with an embodiment of the present disclosure. The electronic device if is similar to the electronic device 1*e* as shown in FIG. 6, and the differences therebetween are described below.

The electronic device if may include an antenna component 80' replacing the antenna component 80. In some embodiments, the antenna component 80' may be partially integrated with the circuit structure 50. In some embodiments, the antenna component 80' may include an antenna pattern 85 disposed on the redistribution layer 51. Some circuits, such as feeding circuit, grounding circuit (not shown) may be disposed within or integrated within the circuit structure 50. For example, feeding circuit, grounding circuit, or other circuits may be integrated within the redistribution layer 51 and/or the redistribution layer 52. In some embodiments, the circuit structure 50 and the antenna pattern 85 may collectively serve as the antenna component 80'.

Figure 8A:
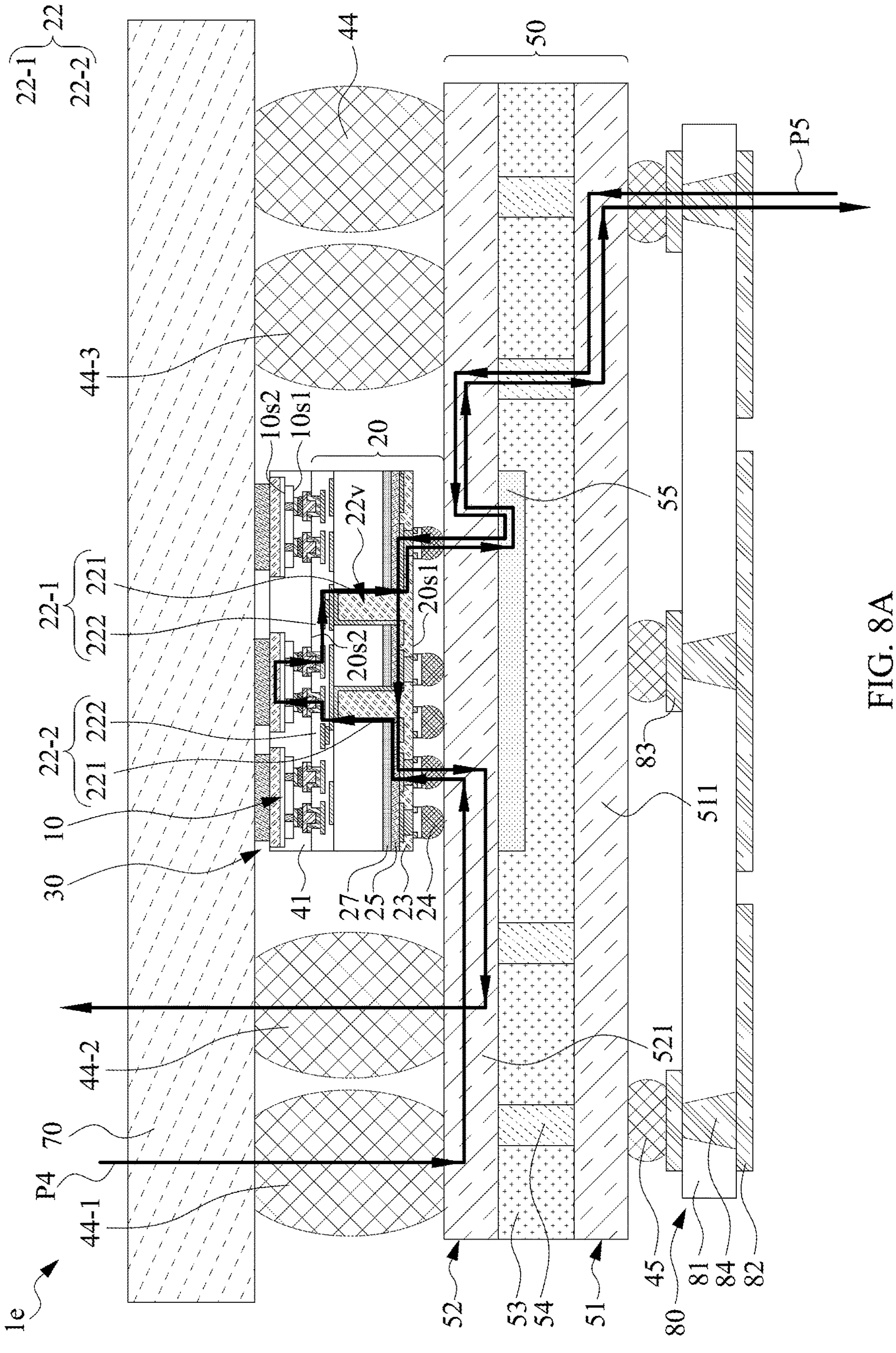
FIG. 8A illustrates signal transmission path(s) of an electronic device, in accordance with an embodiment of the present disclosure.

FIG. 8A illustrates a signal transmission path(s) of an electronic device, such as the electronic device 1*e* as shown in FIG. 6, in accordance with an embodiment of the present disclosure.

In some embodiments, the electronic device 1*e* may be configured to provide a signal transmission path P4. In some embodiments, the signal transmission path P4 may pass through the circuit board 70, the circuit structure 50, the electronic component 20, the electronic component 10, the interconnection structure 22 (e.g., 22-1), the filter circuit 55, and the antenna component 80 in order. In some embodiments, the signal transmission path P4 may pass through the circuit board 70, the electrical connection 44 (e.g., 44-1), the redistribution layer 52, the terminal 24, the active circuit 27 of the electronic component 20, the interconnection structure 22 (e.g., 22-2), the electronic component 10, the interconnection structure 22 (e.g., 22-1), the terminal 24, the redistribution layer 52, the filter circuit 55, the redistribution layer 52, the conductive structure 54, the redistribution layer 51, the electrical connection 45, and the antenna component 80. In some embodiments, the signal transmission path P4 may be free of being processed by the ICs of the electronic component 20 after the signal transmission path P4 passes through the electronic component 10. In some embodiments, the signal transmission path P4 may be free of being processed by the active circuit 27 after the signal transmission path P4 passes through the electronic component 10. In some embodiments, the signal transmission path P4 may be a transmission path of a signal transmitter (e.g., Tx).

In some embodiments, the electronic device 1*e* may be configured to provide a signal transmission path P5. In some embodiments, the signal transmission path P5 may pass through the antenna component 80, the filter circuit 55, the electronic component 20, and the circuit board 70 in order. In some embodiments, the signal transmission path P5 may pass through the antenna component 80, the electrical connection 45, the redistribution layer 51, the conductive structure 54, the redistribution layer 52, the filter circuit 55, the redistribution layer 52, the terminal 24, the active circuit 27 of the electronic component 20, the terminal 24, the redistribution layer 52, the electrical connection 44 (e.g., 44-2), and the circuit board 70. In some embodiments, the signal transmission path P5 may be free of passing through the interconnection structure 22. In some embodiments, the signal transmission path P5 may further pass through the interconnection structure 22 (e.g., 22-1). In some embodiments, the signal transmission path P5 may be a transmission path of a signal receiver (e.g., Rx).

In some embodiments, the signal transmission path P4 may pass through the electrical connection 44-1, which may also be referred to as a first electrode or a first terminal. The signal transmission path P5 may pass through the electrical connection 44-2, which may also be referred to as a second electrode or a second terminal.

In this embodiment, the interconnection structure 22 may be included in a signal transmission path (e.g., P4 and/or P5), which may provide a relatively short path for electrical connection between the electronic components 10 and 20. As a result, the signal loss of the electronic device may be improved.

Figure 8B:
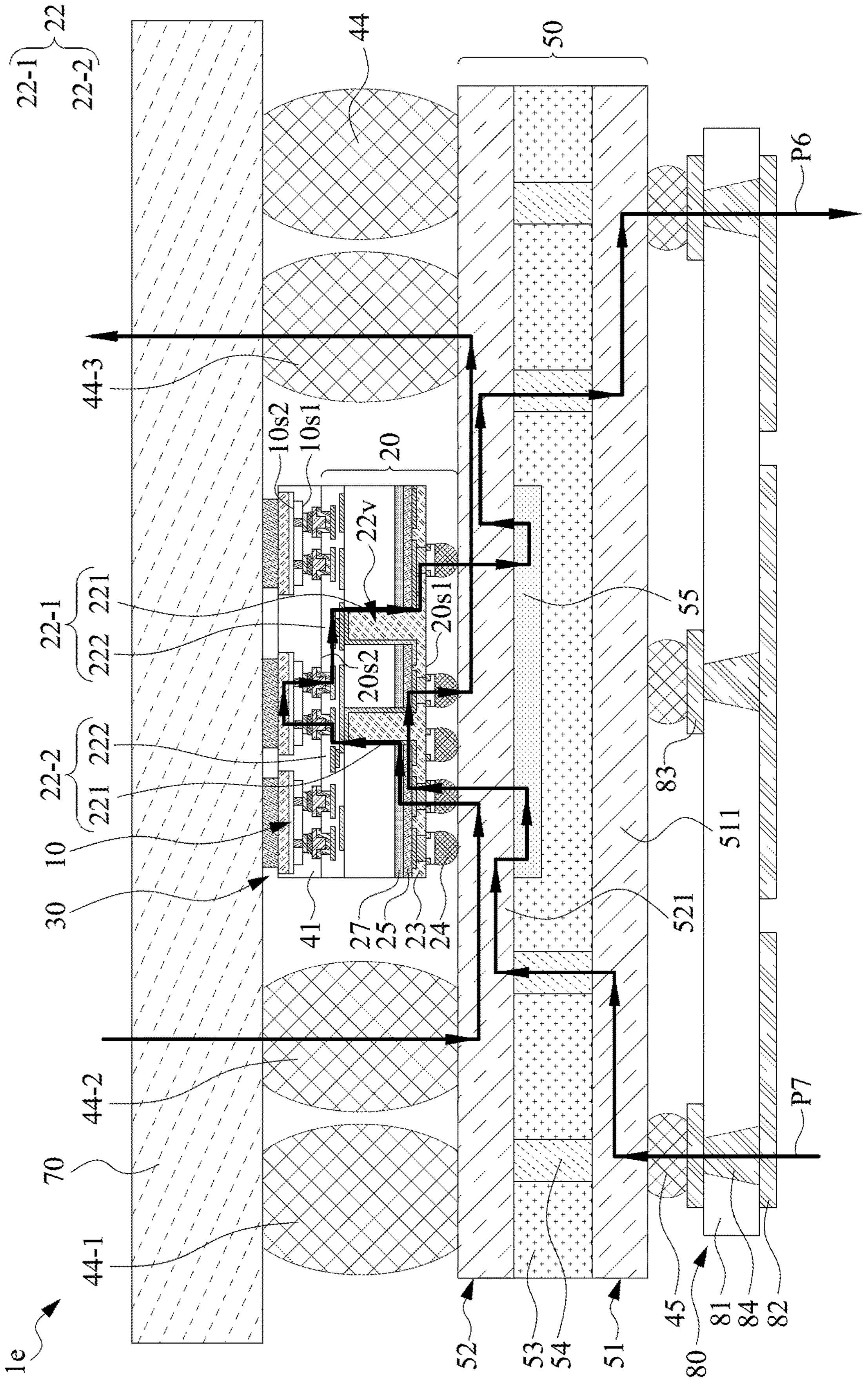
FIG. 8B illustrates signal transmission path(s) of an electronic device, in accordance with an embodiment of the present disclosure.

FIG. 8B illustrates signal transmission path(s) of an electronic device, such as the electronic device 1*e* as shown in FIG. 6, in accordance with an embodiment of the present disclosure.

In some embodiments, the electronic device 1*e* may be configured to provide a signal transmission path P6. In some embodiments, the signal transmission path P6 may pass through the circuit board 70, the circuit structure 50, the electronic component 20, the electronic component 10, the interconnection structure 22 (e.g., 22-1), the filter circuit 55, and the antenna component 80 in order. In some embodiments, the signal transmission path P6 may pass through the circuit board 70, the electrical connection 44 (e.g., 44-2), the redistribution layer 52, the terminal 24, the active circuit 27 of the electronic component 20, the interconnection structure 22 (e.g., 22-2), the electronic component 10, the interconnection structure 22 (e.g., 22-1), the terminal 24, the redistribution layer 52, the filter circuit 55, the redistribution layer 52, the conductive structure 54, the redistribution layer 51, the electrical connection 45, and the antenna component 80.

In some embodiments, the electronic device 1*e* may be configured to provide a signal transmission path P7. In some embodiments, the signal transmission path P7 may pass through the antenna component 80, the filter circuit 55, the electronic component 20, and the circuit board 70 in order. In some embodiments, the signal transmission path P7 may pass through the antenna component 80, the electrical connection 45, the redistribution layer 51, the conductive structure 54, the redistribution layer 52, the filter circuit 55, the redistribution layer 52, the terminal 24, the active circuit 27 of the electronic component 20, the terminal 24, the redistribution layer 52, the electrical connection 44 (e.g., 44-3), and the circuit board 70. In some embodiments, the signal transmission path P7 may further pass through the interconnection structure 22 (e.g., 22-2).

In some embodiments, the signal transmission path P6 may pass through the electrical connection 44-2, and the signal transmission path P7 may pass through the electrical connection 44-3.

In this embodiment, the interconnection structure 22 may be included in a signal transmission path (e.g., P6 and/or P7), which may provide a relatively short path for electrical connection between the electronic components 10 and 20. As a result, the signal loss of the electronic device 1*e* may be improved.

Figure 8C:
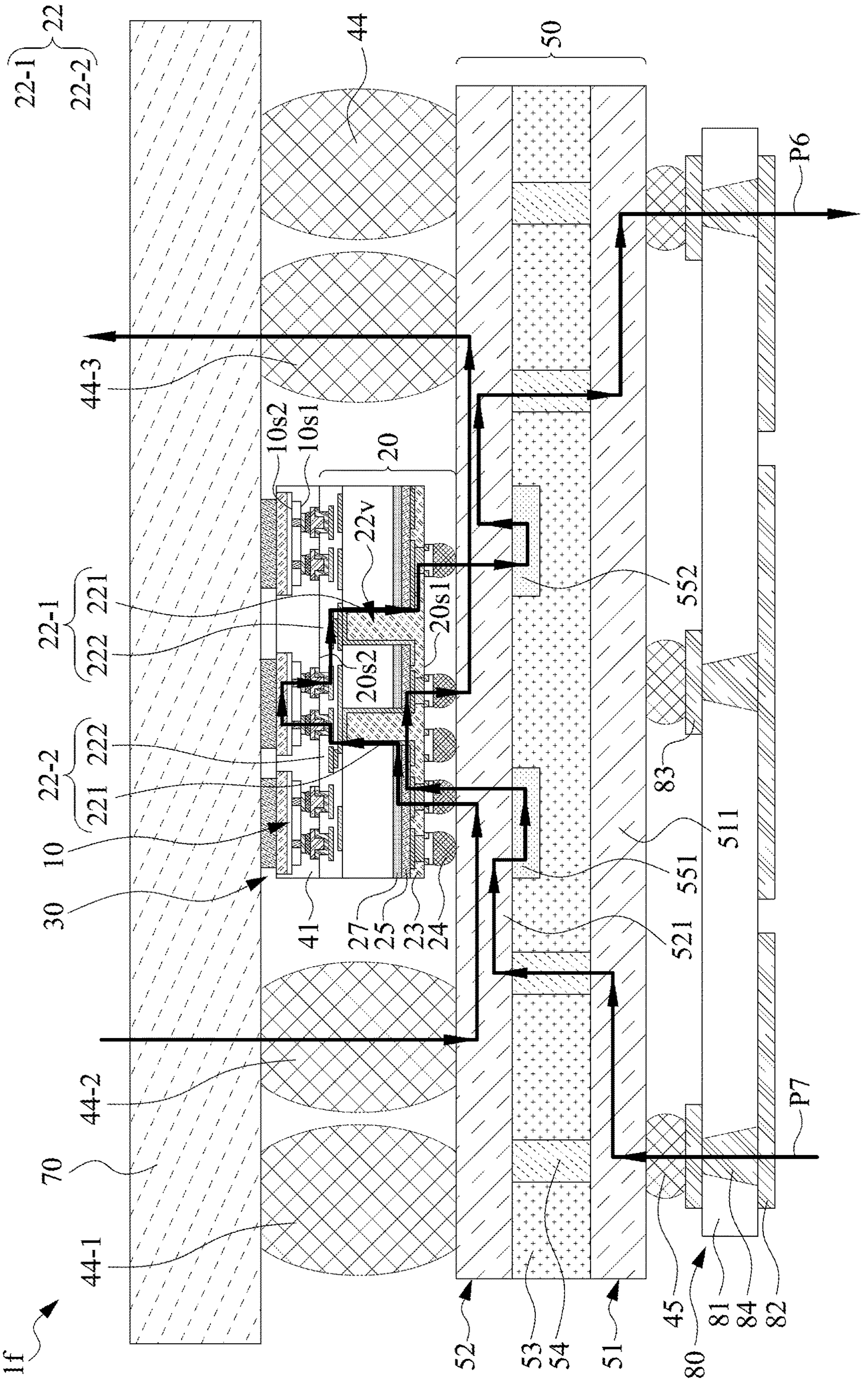
FIG. 8C illustrates signal transmission path(s) of an electronic device, in accordance with an embodiment of the present disclosure.

FIG. 8C illustrates signal transmission path(s) of an electronic device, such as the electronic device 1*e* as shown in FIG. 6, in accordance with an embodiment of the present disclosure.

In some embodiments, the electronic device 1*e* may include a filter circuit 551 and a filter circuit 552 spaced apart from the filter circuit 551. In some embodiments, the signal transmission path P6 passes through the filter circuit 552. In some embodiments, the signal transmission path P6 is free of passing through the filter circuit 551. In some embodiments, the signal transmission path P7 passes through the filter circuit 551. In some embodiments, the signal transmission path P7 is free of passing through the filter circuit 552.

FIG. 9A, FIG. 9B, FIG. 9C, FIG. 9D, and FIG. 9E illustrate cross-sectional views in one or more stages of a method of manufacturing an electronic device in accordance with an embodiment of the present disclosure. At least some of these figures have been simplified to better understand the aspects of the present disclosure. In some embodiments, the electronic device 1*c* may be manufactured through the operations described with respect to FIG. 9A, FIG. 9B, FIG. 9C, FIG. 9D, and FIG. 9E.

Figure 9A:
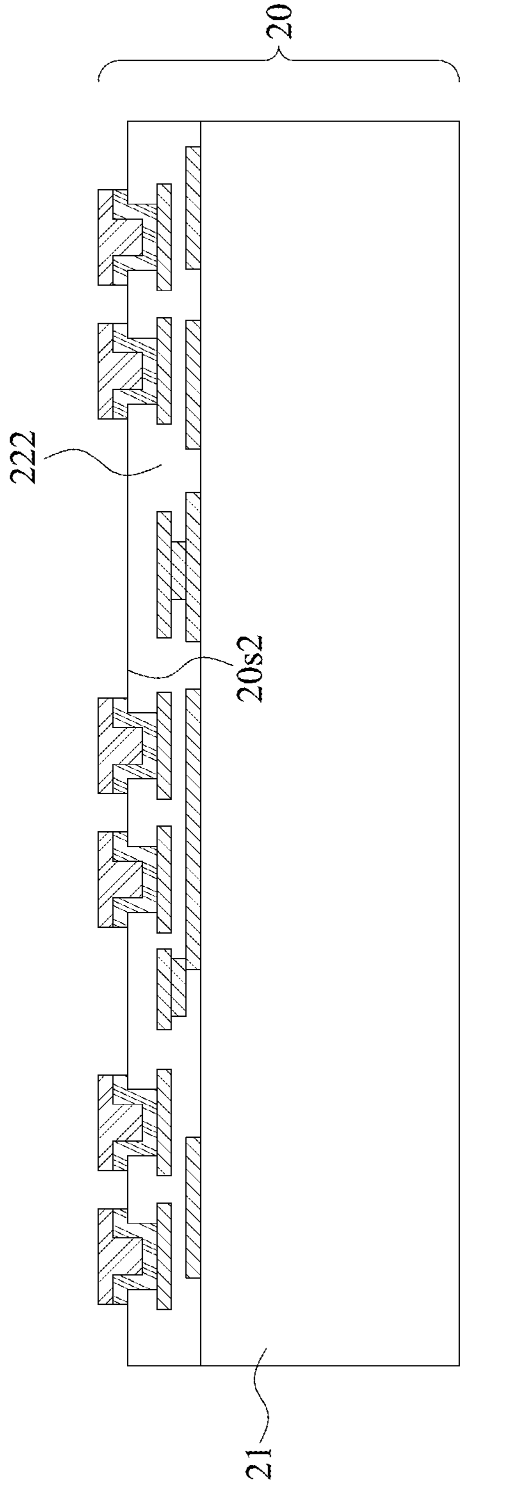
FIG. 9A, FIG. 9B, FIG. 9C, FIG. 9D, and FIG. 9E illustrate cross-sectional views in one or more stages of a method of manufacturing an electronic device in accordance with an embodiment of the present disclosure.

Referring to FIG. 9A, an electronic component 20 may be provided. A redistribution layer 222 may be formed on a backside surface of a substrate 21.

Figure 9B:
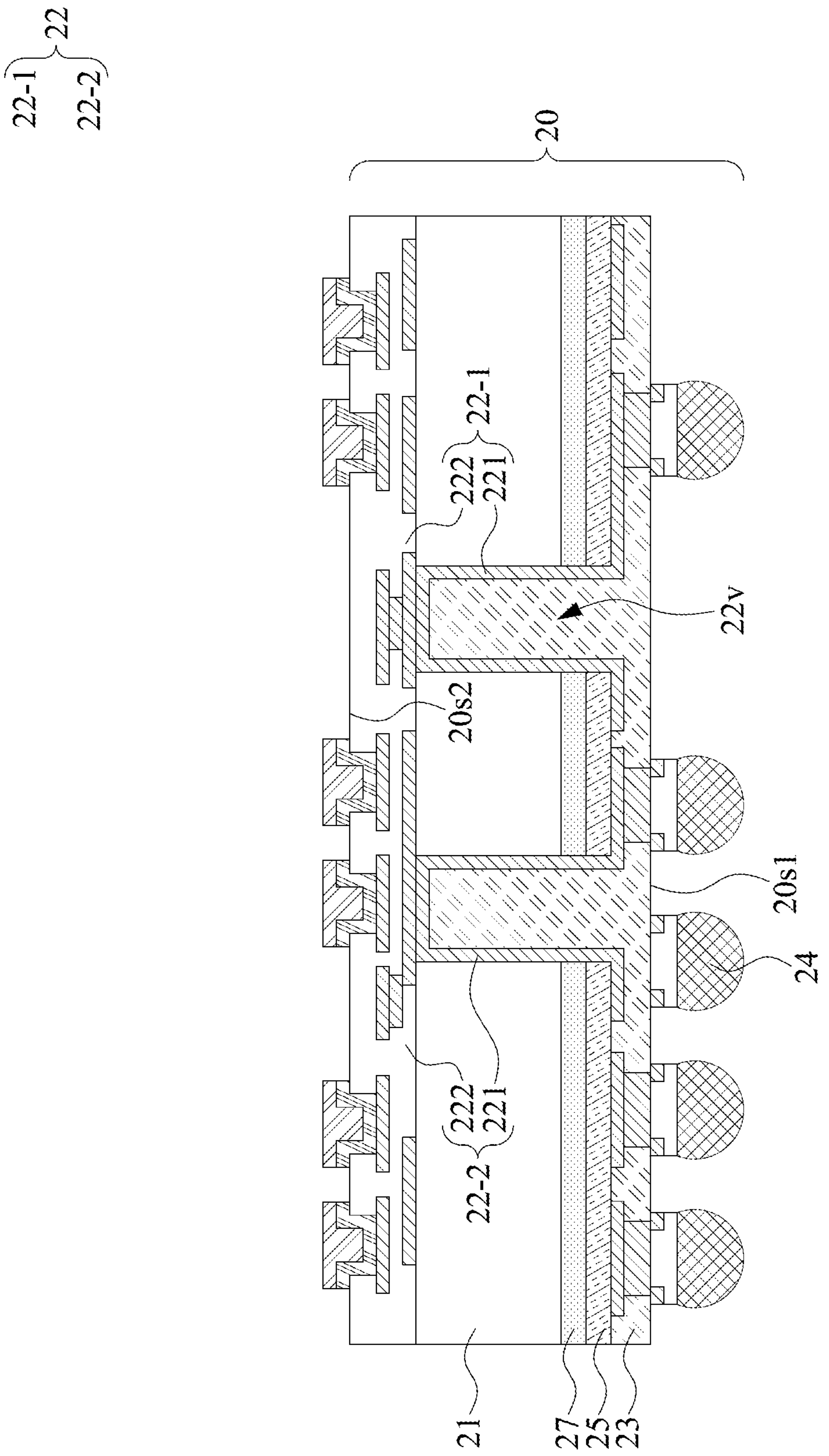

Referring to FIG. 9B, a plurality of interconnection structures 22 (e.g., 22-1 and 22-2) may be formed. Forming the interconnection structure 22 may include forming a via 221, which penetrates the substrate 21. The interconnection structure 22 may penetrate the substrate 21. A dielectric structure 23 may be formed within a hole 22*v*, which extends between surfaces 20*s*1 and 20*s*2 of the electronic component 20. A plurality of terminals 24 may be formed on the surface 20*s*1 of the electronic component 20. A passivation layer 25 may be formed on an active surface of the substrate 21. IC devices may be formed within the substrate 21. In some embodiments, a first carrier (not shown) may be utilized to support the substrate 21, and the terminals 24 may be formed on the surface 20*s*1 of the electronic component 20.

Figure 9C:
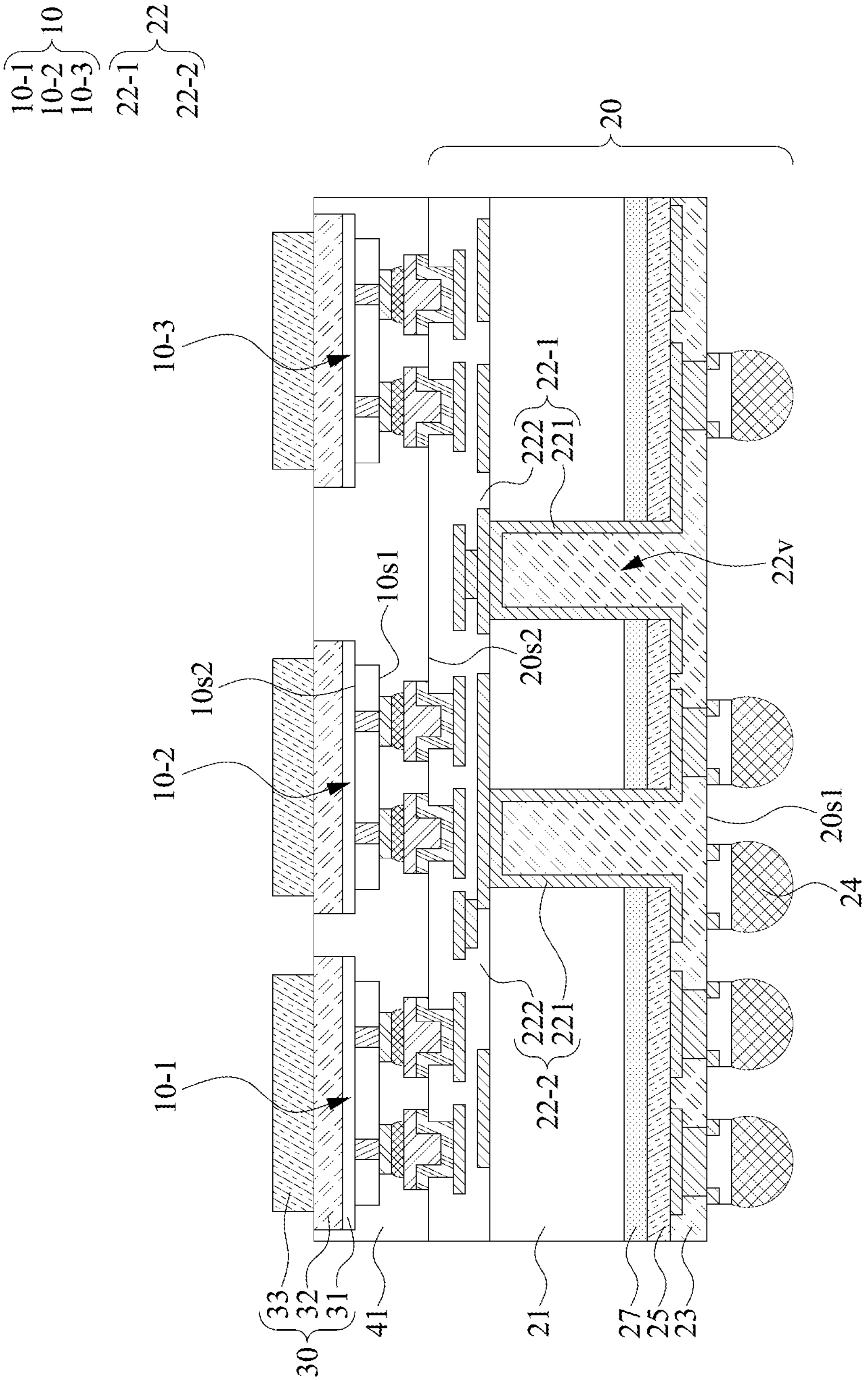

Referring to FIG. 9C, a plurality of electronic components 10 (e.g., 10-1, 10-2, and 10-3) may be formed on the surface 20*s*2 of the electronic component 20. In some embodiments, a second carrier (not shown) may be utilized to support the electronic component 20, and the electronic components 10 may be bonded to the surface 20*s*2 of the electronic component 20. In some embodiments, the conductive structure 30 may be formed on a surface 10*s*2 of the electronic component 10. An encapsulant 41 may be formed to encapsulate the electronic component 10 and a portion of the conductive structure 30.

Figure 9D:
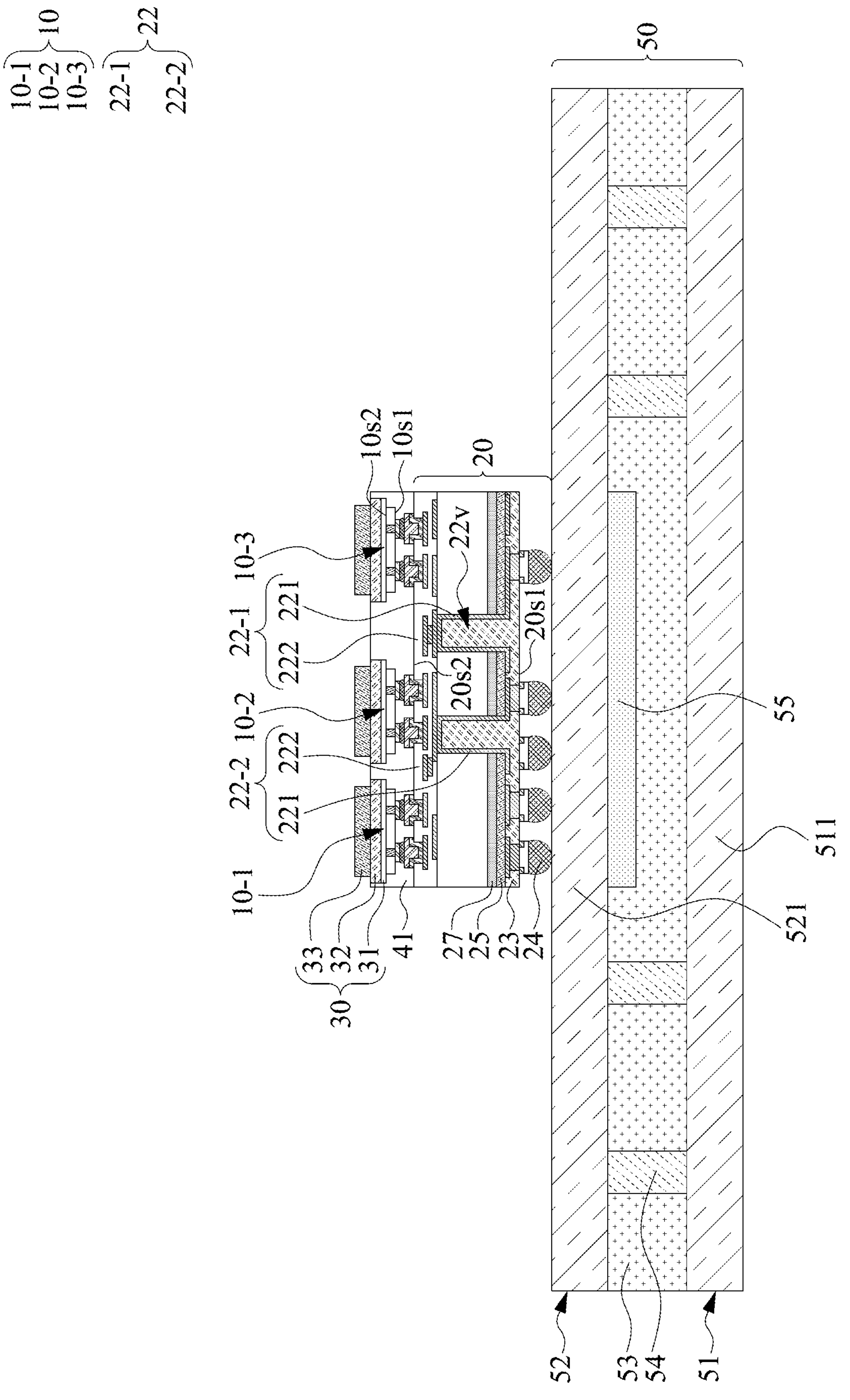

Referring to FIG. 9D, a circuit structure 50 may be formed on the surface 20*s*1 of the electronic component 20. The circuit structure 50 may include a redistribution layer 51, a redistribution layer 52, a dielectric layer 53, a conductive structure 54, and a filter circuit 55. The electronic component 20 may be attached to a redistribution layer 52 of the circuit structure 50.

Figure 9E:
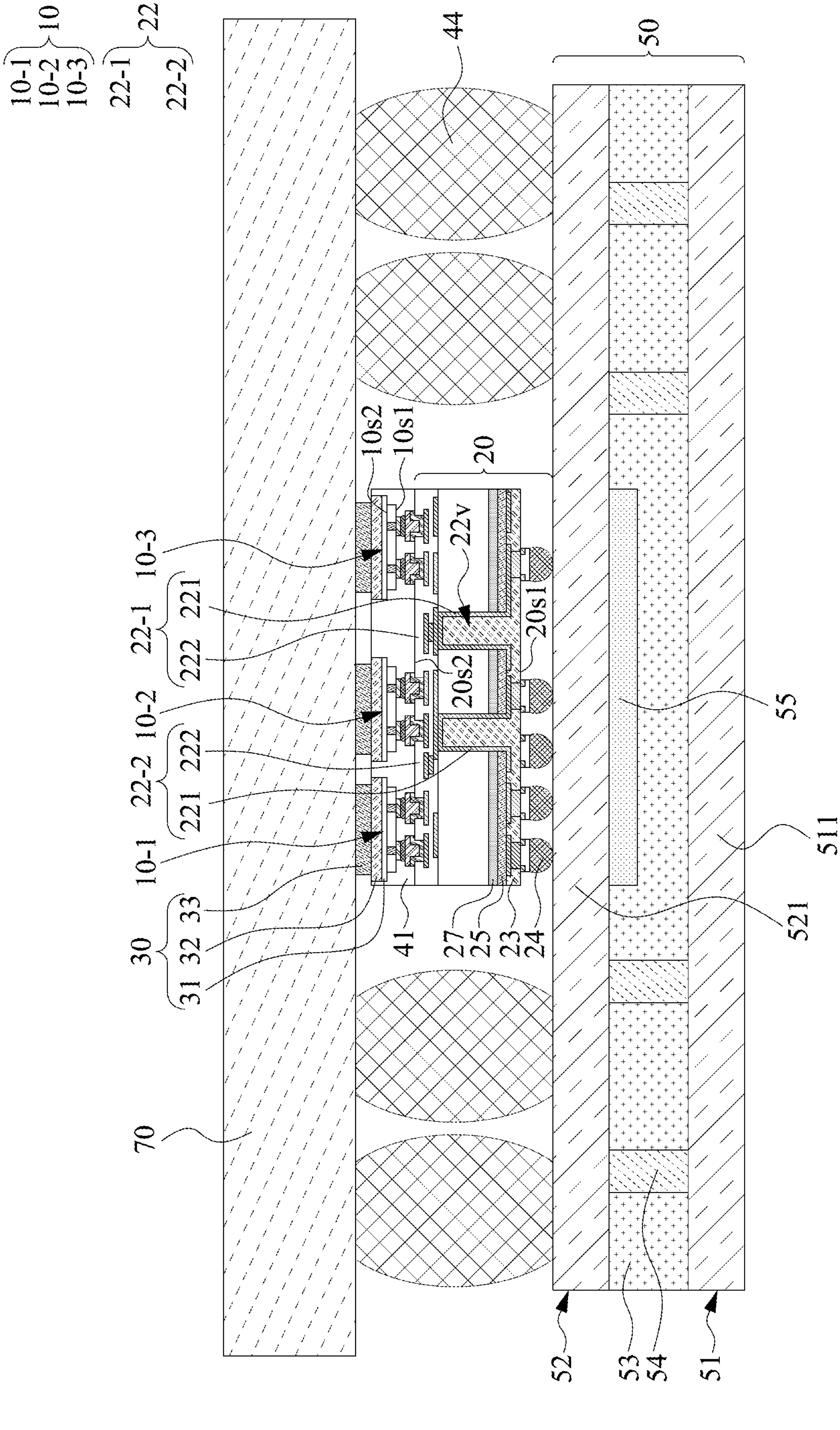

Referring to FIG. 9E, a circuit board 70 may be formed on the surface 10*s*2 of the electronic component 10. In some embodiments, the circuit board 70 may be formed on the conductive structure 30. A plurality of electrical connections 44 may be formed between the circuit board 70 and the circuit structure 50. As a result, an electronic device, such as the electronic device 1*c* as shown in FIG. 4, may be produced.

It is contemplated that if an antenna component 80 is formed on the redistribution layer 51 of the circuit structure 50 in a stage subsequent to that shown in FIG. 9E, an electronic device, such as the electronic device 1*e*, may be produced.

Spatial descriptions, such as "above," "below," "up," "left," "right," "down," "top," "bottom," "vertical," "horizontal," "side," "higher," "lower," "upper," "over," "under," and so forth are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the term "active surface" refers to a surface on which an input and/or output terminal(s) is disposed. Alternatively, the term "active surface" refers to a surface which an IC is disposed on or adjacent to.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

a first electronic component configured to receive a first radio frequency (RF) signal and amplify a first power of the first RF signal; and a second electronic component disposed under the first electronic component, wherein the second electronic component comprises a silicon substrate defining a through hole and a first electrically conductive via within the through hole and extending from an active surface to a backside surface along a sidewall of the silicon substrate of the second electronic component, wherein the first electrically conductive via is configured to provide a path for a transmission of the first RF signal.

2. The electronic device of claim 1, wherein the first electronic component comprises a power amplifier, and the second electronic component comprises a radio frequency integrated circuit.

3. The electronic device of claim 2, wherein an active surface of the first electronic component faces the backside surface of the second electronic component, a terminal is disposed on the active surface, opposite to the backside surface, of the second electronic component, and the sidewall of the silicon substrate is an inner lateral surface that surrounds the first electrically conductive via.

4. The electronic device of claim 3, wherein the terminal comprises a solder material.

5. The electronic device of claim 2, wherein a substrate of the first electronic component comprises a group III-V semiconductor.

6. The electronic device of claim 1, wherein the second electronic component comprises a second electrically conductive via, and the first electrically conductive via and the second electrically conductive via are configured to collectively provide a first signal transmission path and a second signal transmission path between the first electronic component and the second electronic component.

7. The electronic device of claim 6, further comprising:
a third electronic component configured to receive a second RF signal and amplify a second power of the second RF signal, wherein the first electronic component, the third electronic component, and the first electrically conductive via within the silicon substrate of the second electronic component are configured to provide the second signal transmission path.

8. The electronic device of claim 7, wherein the first signal transmission path is configured to transmit a signal passing through an active circuit region, abutting the active surface, of the second electronic component, the first electrically conductive via, the first electronic component, and the second electrically conductive via.

9. The electronic device of claim 6, wherein the first signal transmission path is configured to transmit the first RF signal to an antenna component.

10. An electronic device, comprising:
a power amplifier; and
a radio frequency (RF) die, wherein the RF die has a backside surface facing the power amplifier and a frontside surface opposite to the backside surface, the RF die has a redistribution layer adjacent to the backside surface of the RF die and at least one active component adjacent to the frontside surface of the RF die, and the active component of the RF die is electrically connected to the power amplifier through a through-silicon via (TSV) within the RF die.

11. The electronic device of claim 10,
wherein the power amplifier is electrically connected to the RF die through the redistribution layer, and a lateral surface of the redistribution layer is substantially aligned with a lateral surface of a silicon substrate of the RF die.

12. The electronic device of claim 11, wherein an inner lateral surface of the silicon substrate of the RF die defines a through hole, the TSV is disposed within the through hole, and the power amplifier is configured to receive a signal from the RF die from the frontside surface to the backside surface through the TSV.

13. The electronic device of claim 10, wherein no active component is disposed on the backside surface of the RF die.

14. The electronic device of claim 13, further comprising:
a solder material disposed on the frontside surface of the RF die
wherein the TSV is disposed between the solder material and the redistribution layer.

15. An electronic device, comprising:
an antenna component;
a power amplifier over the antenna component; and
a radio frequency (RF) die disposed between the power amplifier and the antenna component,
wherein the RF die comprises a through silicon via (TSV) electrically connected to the power amplifier and to the antenna component; and
an encapsulant encapsulating the power amplifier, wherein a lateral surface of the encapsulant is substantially coplanar with a lateral surface of a semiconductor substrate of the RF die.

16. The electronic device of claim 15, wherein the antenna component comprises a filter circuit and an antenna pattern, and wherein the power amplifier, the RF die, the filter circuit, and the antenna pattern are configured to collectively provide a first signal transmission path passing through the RF die.

17. The electronic device of claim 15, further comprising:
a circuit structure disposed between the RF die and the antenna component, wherein the circuit structure comprises a first filter circuit, and wherein the power amplifier, the RF die the first filter circuit, and the antenna component are configured to collectively provide a first signal transmission path passing through the RF die.

18. The electronic device of claim 15, wherein the TSV is disposed within a through hole defined by an inner lateral surface of the semiconductor substrate of the RF die, and the lateral surface of the encapsulant is substantially coplanar with an outer lateral surface of the semiconductor substrate of the RF die.

19. The electronic device of claim 15, wherein the RF die comprises an active surface facing the antenna component and a backside surface facing the power amplifier.

20. The electronic device of claim 15, further comprising:
a redistribution layer disposed between the power amplifier and the RF die,
wherein both the TSV and the redistribution layer are electrically connected between the RF die and the power amplifier.

* * * * *